United States Patent [19]

Thompson

[11] Patent Number: 5,714,800
[45] Date of Patent: Feb. 3, 1998

[54] INTEGRATED CIRCUIT ASSEMBLY HAVING A STEPPED INTERPOSER AND METHOD

[75] Inventor: Patrick F. Thompson, Mesa, Ariz.

[73] Assignee: Motorola, Inc., Schaumburg, Ill.

[21] Appl. No.: 619,401

[22] Filed: Mar. 21, 1996

[51] Int. Cl.$^6$ .................. H01L 23/48; H01L 23/12; H01L 23/14; H01L 23/32
[52] U.S. Cl. .................. 257/690; 257/700; 257/792; 257/777; 257/686; 257/692; 257/668
[58] Field of Search .................. 257/690, 692, 257/693, 700–703, 783, 792, 668, 684–686, 711, 777, 778, 782

[56] References Cited

U.S. PATENT DOCUMENTS

| | | | |
|---|---|---|---|
| 5,081,563 | 1/1992 | Feng et al. | 257/700 |
| 5,126,813 | 6/1992 | Takahashi et al. | 257/783 |
| 5,148,265 | 9/1992 | Khandros et al. | 257/668 |
| 5,148,266 | 9/1992 | Khandros et al. | 257/668 |
| 5,227,232 | 7/1993 | Lim | 257/668 |
| 5,258,330 | 11/1993 | Khandros et al. | 437/209 |
| 5,315,486 | 5/1994 | Fillion et al. | 257/700 |
| 5,319,241 | 6/1994 | Lim | 257/783 |
| 5,381,047 | 1/1995 | Kanno | 257/783 |
| 5,402,318 | 3/1995 | Otsuka et al. | 257/700 |
| 5,412,247 | 5/1995 | Martin | 257/684 |
| 5,414,298 | 5/1995 | Grube et al. | 257/690 |
| 5,463,246 | 10/1995 | Matsunami et al. | 257/783 |
| 5,491,362 | 2/1996 | Hamzehdoost et al. | 257/675 |
| 5,528,075 | 6/1996 | Burns | 257/668 |

Primary Examiner—Tom Thomas
Assistant Examiner—Alexander Oscar Williams
Attorney, Agent, or Firm—Rennie William Dover

[57] ABSTRACT

A method of forming an integrated circuit assembly having a stepped interposer (300), an integrated circuit die (200) and an encapsulant (500). The stepped interposer (300) includes a central portion (320) having a plurality of contact regions (360), and a peripheral region (330), completely surrounding the central region (320), having a plurality of bonding regions (350). Some of the contact regions (360) are electrically coupled to some of the bonding regions (350). The integrated circuit die (200) includes a plurality of bonding pads (210) located around its periphery. The stepped interposer (300) is fixably coupled to the integrated circuit die (200) and some of the bonding pads (210) are electrically coupled to some of the bonding regions (350). The stepped interposer (300) of the present invention provides contact regions (360) free from encapsulant (500) and added protection for wirebonds (400) or any other means of electrical coupling.

18 Claims, 3 Drawing Sheets

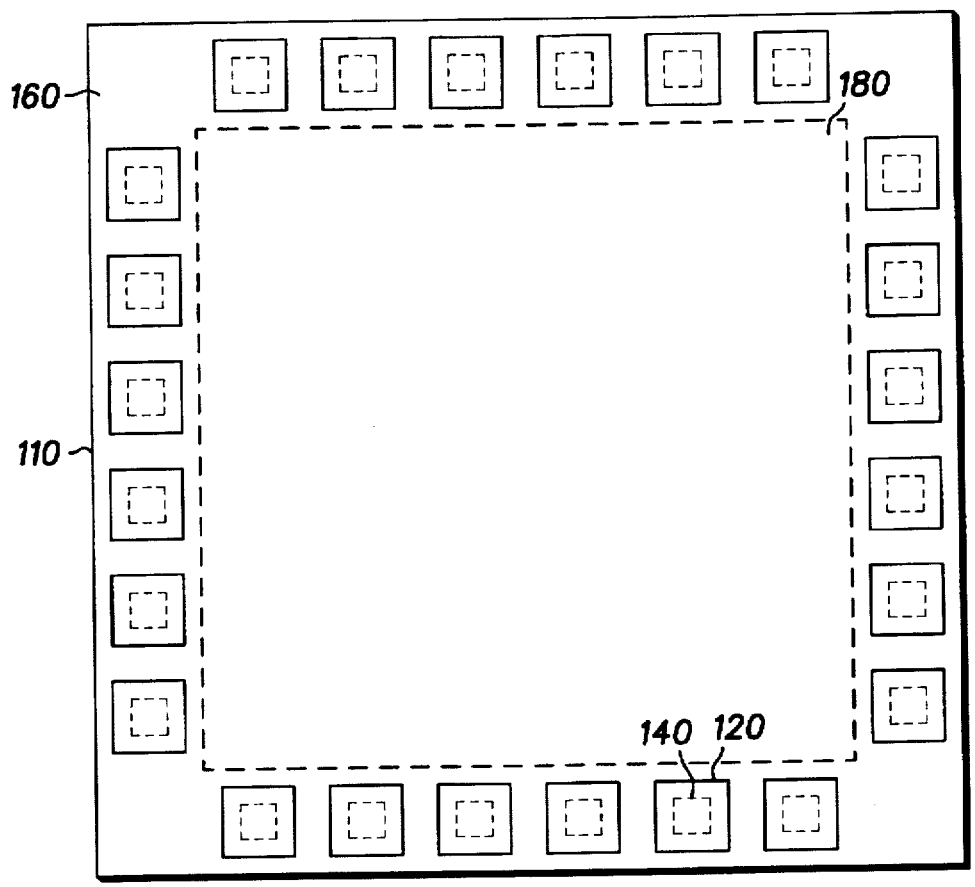
FIG. 1  100
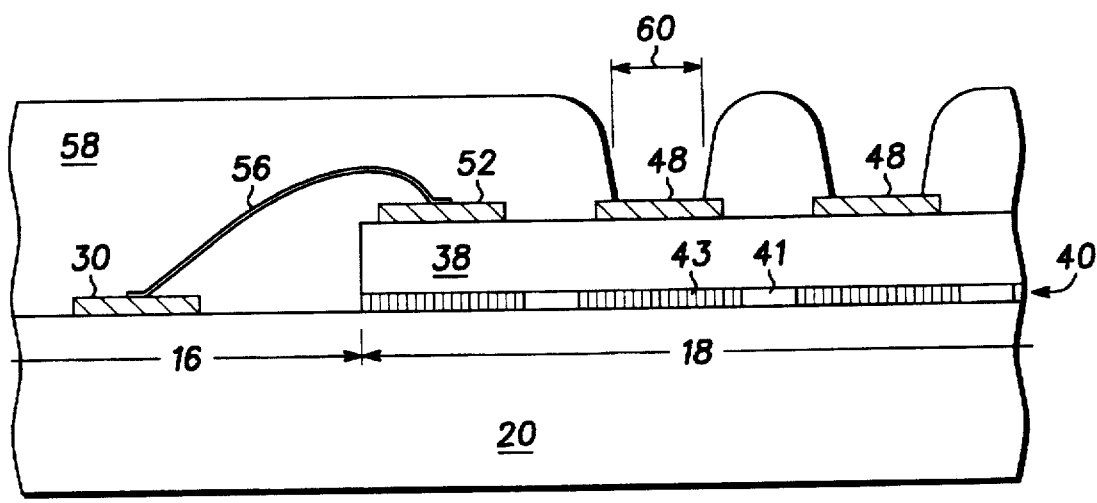
FIG. 2  — PRIOR ART —

INTEGRATED CIRCUIT ASSEMBLY HAVING A STEPPED INTERPOSER AND METHOD

BACKGROUND OF THE INVENTION

The present invention relates, in general, to integrated circuit assemblies and methods of forming such assemblies. More particularly, the present invention relates to integrated circuit assemblies having stepped interposers to achieve chip scale integrated circuit assemblies and methods of forming such assemblies.

Generally, electronic systems contain one or more semiconductor devices that perform electronic operations. These devices are commonly called integrated circuits (ICs). ICs must be electrically connected to the system through a plurality of interconnects. Typically, a structure known as an electronic package is used to provide these electrical connections from the IC to the electronic system. In addition to electrical connections, the electronic package can provide other benefits, such as environmental and mechanical protection for the IC, as well as ease of handling.

A need of the electronic industry, especially for portable electronic products, is to reduce the size and weight of electronic systems. One method to achieve this reduced system size is to reduce the size of traditional electronic packages. Another method is to eliminate them entirely by moving to integrated circuit assemblies that essentially eliminate a separate and distinct electronic package. Recently, the term "chip scale package" (CSP) has been used to describe a new class of integrated circuit assemblies that require an area on the substrate that is just minimally larger than the integrated circuit itself (typically less than 120% of the integrated circuit area).

Many of these integrated circuit assemblies utilize an array of electrical connections within the integrated chip area rather than the traditional electrical connections that extend outward from the contacts on the periphery of the integrated circuits. Thus by eliminating the fan out of package connections that results from the traditional approach, a CSP, much smaller than the traditional package can be achieved.

One such CSP recently developed is described in U.S. Pat. No. 5,258,330, entitled "SEMICONDUCTOR CHIP ASSEMBLIES WITH FAN-IN LEADS", issued Nov. 2, 1993 to inventors Igor Y. Khandros and Thomas H. DiStefano, and assigned to Tessera, Inc. Khandros et al. use an array of electrical connections formed on an interposer that overlies a portion of an integrated circuit. However, the interposer provided by the prior art requires processing after encapsulation to allow contact to be made to the array of electrical connections. For example, if encapsulant is deposited over the entire assembly an etching process can be required to create holes in the encapsulant over each of the array of electrical connections. In the alternative, the prior art can require selective deposition of encapsulant, for example by screen printing. In addition, the prior art semiconductor chip assembly provides little or no protection for wirebonds formed as electrical connections from the integrated circuit die to the interposer.

Thus it would be desirable to provide an integrated circuit assembly with an interposer that allows the formation of an array of electrical connections wherein electrical contact to the array does not require extensive processing after encapsulation. It would also be desirable to provide an integrated circuit assembly that would give additional protection for wirebonds, or other electrical coupling means, formed when electrically coupling the integrated circuit to the alternative interposer. Finally it would be desirable to provide an interposer in an integrated circuit assembly that is economical to manufacture using well known, standard technologies.

BRIEF DESCRIPTION OF THE DRAWINGS

FIG. 1 is a simplified plan view of an integrated circuit die;

FIG. 2 is an enlarged, simplified cross sectional view of a portion of a prior art interposer and integrated circuit die;

DETAILED DESCRIPTION OF THE DRAWINGS

Figure 3:
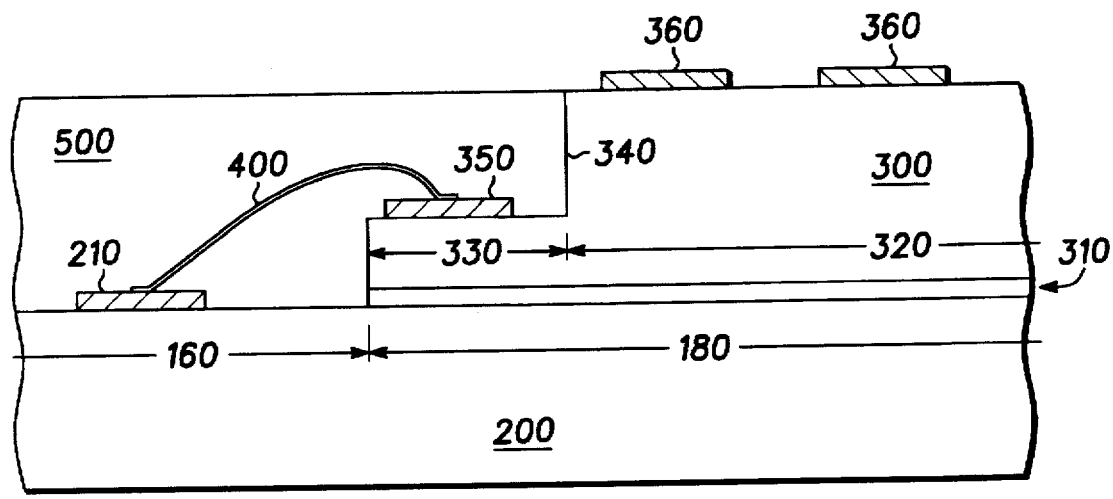
FIG. 3 is an enlarged, simplified cross sectional view of an integrated circuit assembly having a stepped interposer in accordance with an embodiment of the present invention.

The present invention provides a stepped interposer for use in semiconductor assemblies. More particularly the stepped interposer provides, among other things, a structure that allows for an encapsulated or molded semiconductor assembly with an interconnect array that is essentially free of molding compound. Prior art interposers have not provided such a capability. For example, U.S. Pat. No. 5,258,330 entitled "SEMICONDUCTOR CHIP ASSEMBLIES WITH FAN-IN LEADS", issued Nov. 2, 1993 to inventors Khandros et al., and incorporated herein by reference, provides an interposer that is absent this feature.

Turning first to FIG. 1, a simplified plan view of an integrated circuit die or IC die 100 having a front surface 110 is illustrated. Front surface 110 of IC die 100 comprises a central region 180 and a peripheral region 160 surrounding central region 180. A plurality of bonding pads 120 are shown formed within peripheral region 160. Bonding pads 120 provide input/output (I/O) connectivity from electrical circuitry (not shown) formed within central region 180 to external means (not shown), for example a printed circuit board or the like. Typically, front surface 110 has a dielectric or passivation layer (not shown) disposed thereon to provide both physical and electrical isolation for IC die 100. A plurality of bonding pad openings 140 are formed in the passivation layer to allow electrical coupling to bonding pads 120, as will be described herein.

Referring now to FIG. 2, an enlarged, simplified cross sectional view of a portion of a prior art interposer 38 and integrated circuit die 20 are shown. Peripheral region 16 of IC die 20 has a peripheral contact or bonding pad 30 formed thereon. Interposer 38 is depicted as disposed over central region 18 of IC die 20, while only a portion of IC die 20 and interposer 38 is shown, interposer 38 is disposed over at least a major portion of central region 18.

Interposer 38 is fixed to central region 18 through bottom layer 40. Bottom layer 40 is represented as a compliant, low modulus, non-continuous layer, comprised of masses 43 and holes 41. Interposer 38 comprises pre-formed terminals 48 and bonding terminals 52. Bonding wire 56 electrically couples IC die 20 to interposer 38 through bonding terminals 52. Dielectric encapsulant 58 is depicted after application over interposer 38, IC die 20 and bonding wire 56. It should be noted that only encapsulant 58 serves to protect bonding wire 56 from mechanical damage. It will be understood that holes 60 result from methods known to those skilled in the art. It will also be understood that only one bonding pad 30, one bonding terminal 52 and two pre-formed terminals 48 are shown for ease of illustration and understanding, and that they represent a plurality of bonding pads 30, pre-formed terminals 48 and bonding terminals 52.

Turning now to FIG. 3, an enlarged, simplified cross sectional view of an integrated circuit assembly having a stepped interposer 300 in accordance with an embodiment of the present invention is depicted. It will be understood that for ease of comparison, FIGS. 2 and 3 represent similar regions of the respective inventions.

Peripheral region 160 of IC die 200 has bonding pad 210 formed thereon. It will be understood that while only one bonding pad 210 is shown, IC die 200 comprises a plurality of bonding pads 210. Additionally, IC die 200 has a stepped interposer 300 disposed over central region 180 of IC die 200. While only a portion of IC die 200 and stepped interposer 300 is shown, it will be understood that stepped interposer 300 is disposed over at least a major portion of central region 180. It will be further understood that stepped interposer 300 can comprise any number of organic materials commonly employed in the manufacture of multilayer printed circuit boards (PCBs) or a variety of inorganic or ceramic materials well known in the semiconductor packaging arts. Thus reinforced epoxy, polyimide, bisthaleimide or chloroflurocarbon are typical organic materials that are known, and aluminum oxide, silicon nitride, silicon carbide or mullite are typical inorganic or ceramic materials that are known. It will be understood that the present invention is not limited to any specific organic or inorganic materials. Materials other than those listed may also be used to form stepped interposer 300.

Stepped interposer 300 is fixed to central region 180 through adhesive layer 310. Adhesive layer 310 can be any of the commonly employed non-conductive adhesive materials used to fixably attach an IC die to an organic or inorganic substrate. For example, adhesive layer 310 can be an epoxy or a silicone adhesive material. Typically, adhesive layer 310 will be a continuous layer, however adhesive layer 310 can be of a non-continuous form, such as depicted for layer 44 in FIG. 2.

Stepped interposer 300 comprises a central portion 320 and a peripheral portion 330, wherein it is understood that peripheral portion 330 completely surrounds central portion 320. In addition, peripheral portion 330 is stepped down from central portion 320 to form a stepped edge 340. Additionally, stepped interposer 300 comprises bonding region or bonding area 350 and contact regions or contact areas 360. It will be understood that bonding region or bonding area 350 is a member of a plurality of bonding regions or bonding areas 350 disposed on peripheral portion 330, and that contact regions or contact areas 360 are members of a plurality of contact regions or contact areas 360 disposed on central portion 320. Finally, it will be understood that bonding regions 350 are electrically coupled to at least some of contact regions 360.

Figure 4:
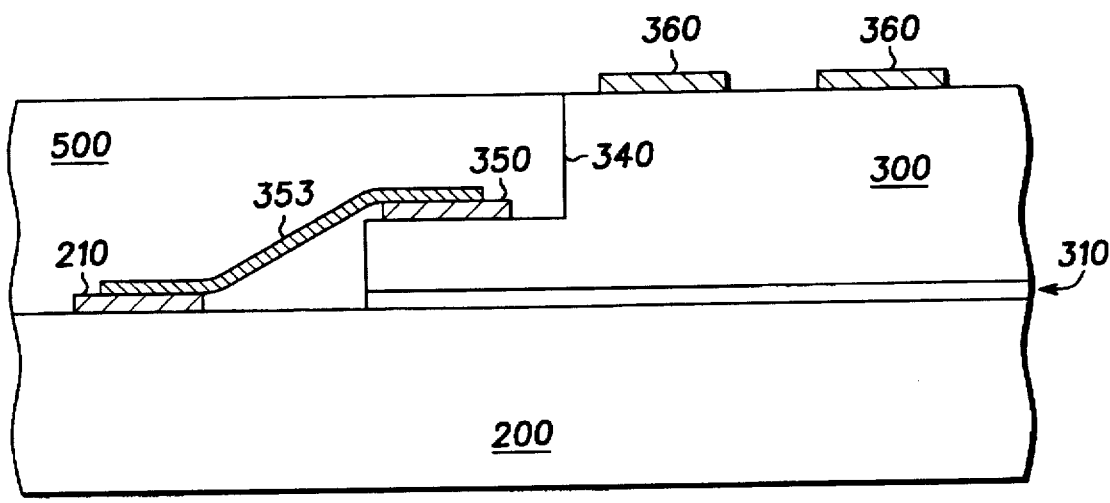
FIG. 4 is an enlarged, simplified cross sectional view of an integrated circuit assembly having a stepped interposer in accordance with another embodiment of the present invention.

IC die 200 is electrically coupled to stepped interposer 300 through bonding wire 400. Alternative methods of electrically coupling IC die 200 to stepped interposer 300 are also possible and are within the scope of the present invention. For example, briefly referring to FIG. 4, an enlarged, simplified cross sectional view of an integrated circuit assembly having a stepped interposer 300 in accordance with another embodiment of the present invention is depicted, wherein bonding region 350 is electrically coupled with bonding pad 210 through flexible lead 353. Flexible lead 353 can be formed, for example, using tape automated bonding (TAB) technology. Thus a plurality of flexible leads 352 can be formed and electrically coupled to bonding pads 210 and bonding region 350. It will be understood, that other means of forming flexible leads 352, in addition to TAB technology, can also be employed and are intended to be within the scope of the present invention. It should be understood that the same reference numerals are used in the figures to denote the same elements.

Referring again to FIG. 3, portions of stepped interposer 300 and IC die 200 are shown encapsulated by encapsulant 500. While it will be understood that a variety of methods for encapsulation are known, it is a particular advantage of stepped interposer 300 to mold encapsulant 500 or to otherwise form encapsulant 500 wherein stepped interposer 300 forms a portion of a mold or containment means (not shown) for encapsulant 500. In this manner plurality of contact regions 360 can be readily kept free of encapsulant. Thus no additional process steps, as required by the prior art, are required by embodiments of the present invention to provide for electrical contact to plurality of contact regions 360. It will be understood that encapsulant 500 can comprise any of the commonly used semiconductor encapsulating materials such as an epoxy or silicone material.

It will also be understood that stepped edge 340 need not be part of a mold or containment means (not shown) to readily keep contact regions 360 clear of encapsulant. Thus encapsulant 500 can be applied as an uncured, viscous fluid to overlie peripheral region 160 and peripheral portion 330, wherein stepped edge 340 will act as a barrier to any flow of encapsulant 500 prior to its hardening in a cure cycle.

It should be apparent that the height of stepped edge 340 can be a factor in providing mechanical protection for wirebond 400 that is in addition to the protection provided by encapsulant 500. Thus, the height of stepped edge 340 should be sufficient to extend beyond the highest point of wirebond 400. In this manner, the strength of stepped interposer 300 can be added to that of encapsulant 500 to form a mechanically stronger integrated circuit assembly than could have been formed without stepped edge 340. It has been found that stepped edge 340 provides protection as for wirebond 400 when stepped edge 340 extends above wirebond 400 by at least approximately 0.05 millimeter (mm). However, it would be preferred to have stepped edge 340 extend at least approximately 0.1 mm above wirebond 400. It will also be understood that the protection afforded by stepped interposer 300 and encapsulant 500 in combination, can be an advantage for other electrical coupling means in addition to wirebonds 400, for example flexible leads 352 would also benefit.

Figure 5:
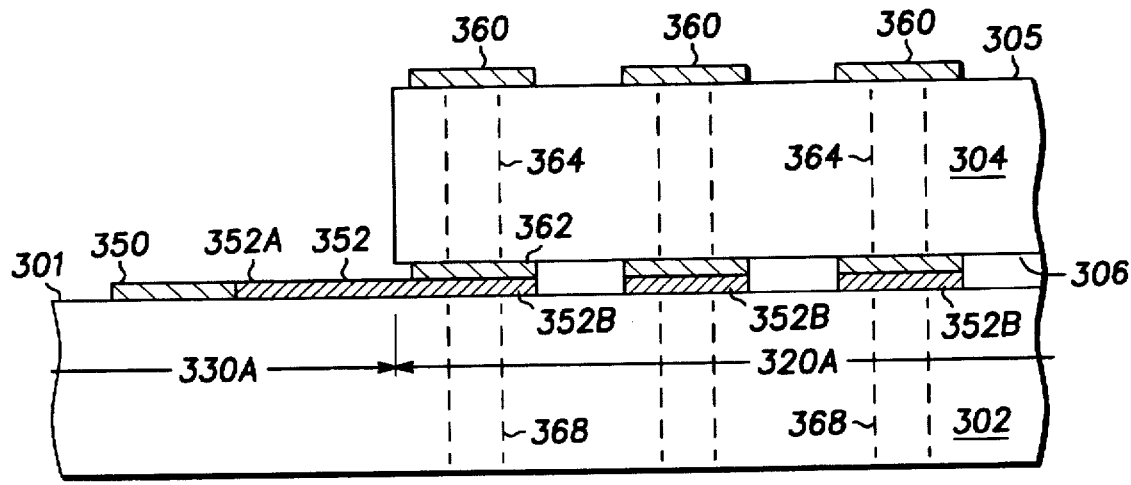
FIG. 5 is an enlarged, simplified cross sectional view of an embodiment of a stepped interposer during formation in accordance with the present invention.

Turning now to FIG. 5, an enlarged, simplified cross sectional view of an embodiment of a stepped interposer 300A during formation is depicted. Stepped interposer 300A is depicted as comprising a lower portion 302 and an upper portion 304. Lower portion 302 comprises peripheral region 330A and central region 320A as previously described. It will understood that regions 320 and 330 described in FIG. 3 referred to a completed stepped interposer 300, wherein regions 320A and 330A refer to a stepped interposer 300A during formation. Additionally, lower portion 302 comprises a first lower surface 301 wherein bonding region 350 and a plurality of conductive traces 352 are formed thereon. Each bonding region 350 is electrically coupled to a first end 352A of at least one conductive trace 352. In addition, each of the conductive traces 352 extends inwardly from peripheral region 330A into central region 320A wherein each conductive trace 352 terminates at a second end 352B to form an array (not shown). Bonding regions 350 and conductive traces 352 can be formed by any of the commonly employed methods well known to one skilled in the art. For example, if lower portion 302 is comprised of an organic material, bonding regions 350 and conductive traces 352 are typically formed by a plating process.

Upper portion 304 comprises a first upper surface 305 and a second upper surface 306. A plurality of lower contact regions 362 is depicted disposed on second upper surface 306. Lower contact regions 362 can be formed by any of the commonly employed methods, for example by plating. For example, if upper portion 304 is an organic material, common PCB methods such as plating can be used to form conductive regions 362. It will be understood that plurality of lower contact regions 362 are so arranged as to correspond in location and spacing from one another to match the array (not shown) formed by each second end 352B of plurality of conductive traces 352 disposed on first lower surface 301. In this manner upper portion 304 can be aligned with and fixably coupled to lower portion 302 wherein each second end 352B is electrically coupled to each of second plurality of lower contact regions 362. When upper portion 304 is comprised of an organic PCB material, upper portion 304 can be fixably coupled to lower portion 302 by means of an adhesive film or layer (not shown) as is common practice in forming multilayer PCBs. For example an adhesive film (not shown), comprising for example a B-stage epoxy material, can be positioned to overlay central portion 320A of lower portion 302. Upper portion 304 is then aligned to lower portion 302, as previously described, and the adhesive film (not shown) cured to complete coupling of upper portion 304 to lower portion 302.

Electrical coupling of lower contact regions 362 to the array (not shown) formed by each second end 352B is affected by the formation of upper contact regions 360 and conductive vias 364. The formation of upper contact regions 360 and conductive vias 364 includes the formation of a hole through upper portion 304, each lower contact region 362, each second end 352B and lower portion 302, after upper portion 304 is fixably coupled to lower portion 302. A plating mask (not shown) is then formed and the partially completed stepped interposer 300A is placed in a plating bath wherein conductive vias 364 and upper contact regions 360 are formed. In this manner electrical coupling of bonding regions 350 to upper contact regions 360 is accomplished.

It will be understood that while a process for assembling stepped interposer 300 comprised of PCB materials has been described, stepped interposer 300 is not limited to PCB materials and can be alternatively formed from ceramic materials or any combination of PCB and ceramic materials.

Figure 6:
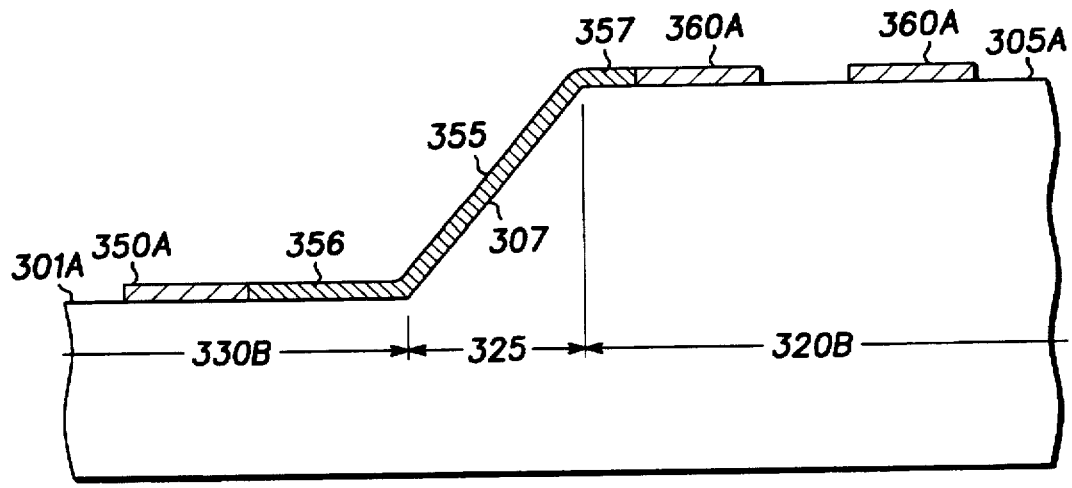
FIG. 6 is an enlarged, simplified cross sectional view of another embodiment of a stepped interposer during formation in accordance with the present invention.

Referring to FIG. 6 an enlarged, simplified cross sectional view of another embodiment of a stepped interposer 300B during formation is shown. Stepped interposer 300B is depicted as comprising peripheral region 330B having a first surface 301A, a sloped region 325 having a second surface 307 and a central region 320B having a third surface 305A. Additionally, a plurality of bonding regions 350A and a plurality of contact regions 360A are disposed on first surface 301A and third surface 305A respectively. A plurality of conductive traces 355 are depicted as having a first end 356 electrically coupled to each bonding region 350A and a second end 357 electrically coupled to each contact region 360A. Conductive traces 355 are further shown disposed on sloped region 325 whereby a continuous conductive path is formed to electrically couple each bonding region 350A to a corresponding contact region 360A. It will be understood that a single coupling to contact region 360A is shown for ease of illustration only.

Stepped interposer 300B is formed as a single piece or assembled into a single piece before any conductive regions are formed. Thus, it is possible to form all conductive regions with a single process step. For example, plurality of bonding regions 350A, plurality of contact regions 360A and plurality of conductive traces 355 can comprise a single conductive pattern and be formed on stepped interposer 300B by a process that includes screen printing, vacuum deposition, plating or the like.

By now it should be appreciated that embodiments of an integrated circuit assembly having a stepped interposer and methods for making the stepped interposer have been disclosed. The integrated circuit assembly having a stepped interposer, in accordance with the present invention, provides for the formation of an array of electrical connections wherein electrical contact to the array does not require extensive processing after encapsulation. Additionally, an integrated circuit assembly having a stepped interposer, in accordance with the present invention, provides protection, in addition to encapsulation, for wirebonds, or other coupling means, formed when electrically coupling the integrated circuit to the stepped interposer. Further the present invention provides methods for forming integrated circuit assemblies having a stepped interposer that are both economical to manufacture and use well known, standard technologies. It will be understood that specific enhancements over the prior art integrated circuit assembly have been disclosed that make evident the improvements of the present invention.

I claim:

1. An integrated circuit assembly having a stepped interposer, comprising:
   a central portion of said stepped interposer;
   a peripheral portion of said stepped interposer, wherein said peripheral portion surrounds said central portion and is stepped down from said central portion;
   a plurality of electrically isolated contact areas disposed on said central portion;
   a plurality of electrically isolated bonding areas disposed on said peripheral portion wherein at least some of said electrically isolated contact areas are electrically coupled to at least some of said electrically isolated bonding areas; and
   an integrated circuit die having a plurality of bonding pads, wherein said stepped interposer overlies at least a portion of said integrated circuit die, and at least some of said bonding pads are electrically coupled to at least some of said electrically isolated bonding areas.

2. The integrated circuit assembly having a stepped interposer of claim 1 wherein said stepped interposer comprises an organic material selected from the group consisting of reinforced epoxy, polyimide, bisthaleimide and chlorofluorocarbon.

3. The integrated circuit assembly having a stepped interposer of claim 1 wherein said stepped interposer comprises a ceramic material selected from the group consisting of aluminum oxide, silicon nitride, silicon carbide and mullite.

4. The integrated circuit assembly having a stepped interposer of claim 1 wherein said central portion is comprised of an upper portion comprising a first material and said peripheral portion is comprised of a lower portion comprising a second material.

5. The integrated circuit assembly having a stepped interposer of claim 4 wherein said first material and said second material are each selected from the group consisting of aluminum oxide, silicon nitride, silicon carbide, mullite, reinforced epoxy, polyimide, bisthaleimide and chloroflurocarbon.

6. The integrated circuit assembly having a stepped interposer of claim 1 wherein said integrated circuit die further comprises a central region and a peripheral region, wherein said peripheral region completely surrounds said central region.

7. The integrated circuit assembly having a stepped interposer of claim 6 further comprising an adhesive layer disposed on at least a portion of said central region, wherein said adhesive layer fixably couples said stepped interposer and said integrated circuit die.

8. The integrated circuit assembly having a stepped interposer of claim 1 further comprising wirebonds, wherein said wirebonds electrically couple said stepped interposer to said integrated circuit die.

9. The integrated circuit assembly having a stepped interposer of claim 1 further comprising a plurality of flexible leads, wherein said plurality of flexible leads electrically couple said stepped interposer to said integrated circuit die.

10. The integrated circuit assembly having a stepped interposer of claim 1 further comprising an encapsulant, wherein said encapsulant overlies said peripheral portion.

11. The integrated circuit assembly having a stepped interposer of claim 10 wherein said encapsulant is essentially level with an upper surface of said central portion.

12. An integrated circuit assembly, comprising:
a stepped interposer having a first upper surface, and a second upper surface, wherein said first upper surface comprises a central portion of said stepped interposer and wherein said second upper surface comprises a peripheral portion of said stepped interposer surrounding said central portion and wherein said central portion is elevated with respect to said peripheral portion;
a plurality of electrically isolated package interconnects disposed on said first upper surface;
a plurality of electrically isolated bonding regions disposed on said second upper surface, wherein at least some electrically isolated bonding regions are electrically coupled to at least some of said electrically isolated package interconnects; and
an integrated circuit chip having a front surface, wherein said front surface comprises a central region and a peripheral region surrounding said central region and wherein said integrated circuit chip further comprises a plurality of bonding pads disposed within said peripheral region and extending to said front surface and wherein said stepped interposer overlies at least a portion of said central region of said integrated circuit chip and wherein at least some of said plurality of bonding pads are electrically coupled to at least some of said electrically isolated bonding regions.

13. The integrated circuit assembly of claim 12 wherein said stepped interposer comprises a material selected from the group consisting of aluminum oxide, silicon nitride, silicon carbide, mullite, reinforced epoxy, polyimide, bisthaleimide and chlorofluorocarbon.

14. The integrated circuit assembly of claim 12 wherein said stepped interposer comprises an upper portion and a lower portion and wherein said upper portion and said lower portion are each comprised of a material selected from the group consisting of aluminum oxide, silicon nitride, silicon carbide, mullite, reinforced epoxy, polyimide, bisthaleimide and chloroflurocarbon.

15. The integrated circuit assembly of claim 12 wherein the stepped interposer is fixably coupled to said central region.

16. The integrated circuit assembly of claim 12 further comprising an encapsulant, wherein said encapsulant is disposed over said peripheral region and is essentially level with said first upper surface.

17. A method for manufacturing an integrated circuit assembly, comprising the steps of:
providing an integrated circuit die;
providing a stepped interposer, wherein said stepped interposer is disposed overlying at least a portion of said integrated circuit die, and wherein said step of providing the stepped interposer further comprises the steps of:
providing the stepped interposer having a peripheral region completely surrounding a central region, wherein said central region is elevated from said peripheral region;
forming an array of electrically isolated contact regions disposed on said central region;
forming a plurality of electrically isolated bonding regions disposed on said peripheral region; and
electrically coupling at least some of said electrically isolated bonding regions to said electrically isolated contact regions;
electrically coupling said stepped interposer to said integrated circuit die; and
encapsulating at least a portion of said integrated circuit die and said stepped interposer.

18. The method of claim 17 wherein the step of providing an integrated circuit die, further comprises providing an integrated circuit die having a plurality of peripheral bonding pads.

* * * * *